(12) United States Patent
Ueshima

(10) Patent No.: US 7,451,805 B2
(45) Date of Patent: Nov. 18, 2008

(54) POURING APPARATUS FOR MOLTEN METAL AND CASTING METHOD

(75) Inventor: Minoru Ueshima, Matsudo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 133 days.

(21) Appl. No.: 10/594,577

(22) PCT Filed: Mar. 31, 2005

(86) PCT No.: PCT/JP2005/006809

§ 371 (c)(1),
(2), (4) Date: Sep. 27, 2006

(87) PCT Pub. No.: WO2005/095023

PCT Pub. Date: Oct. 13, 2005

(65) Prior Publication Data

US 2008/0128105 A1     Jun. 5, 2008

(30) Foreign Application Priority Data

Apr. 2, 2004   (JP)   ............................. 2004-109628

(51) Int. Cl.
*B22D 19/14* (2006.01)
(52) U.S. Cl. ..................... 164/97; 164/335; 164/900
(58) Field of Classification Search .................. 164/97, 164/900, 335
See application file for complete search history.

(56) References Cited

U.S. PATENT DOCUMENTS

| 3,401,126 | A | | 9/1968 | Miller et al. ................. 252/514 |
| 5,524,699 | A | * | 6/1996 | Cook ............................ 164/97 |
| 6,225,503 | B1 | * | 5/2001 | Rigdon et al. ............... 564/441 |
| 2003/0085253 | A1 | | 5/2003 | Shimizu et al. ............. 228/56.3 |

FOREIGN PATENT DOCUMENTS

| JP | 42022634 | | 12/1967 |
| JP | 55023256 | | 2/1980 |
| JP | 59143566 | | 9/1984 |
| JP | 06-31486 | * | 2/1994 |
| JP | 07179956 | | 7/1995 |
| JP | 2000256728 | | 9/2000 |

OTHER PUBLICATIONS

Chi-Won Hwang et al: "Joint reliability and high temperature stability of Sn-Ag-Bi lead-free solder with Cu and Sn-Pb/Ni/Cu substrates", published in Materials Science & Engineering a (Structural Materials: Properties, Microstructure and Processing), vol. A373, No. 1-2 (May 25, 2004), pp. 187-194, XP-002427195.

* cited by examiner

Primary Examiner—Kuang Lin
(74) Attorney, Agent, or Firm—Michael Tobias

(57) ABSTRACT

A pouring apparatus for molten metal includes a stirrer installed in a reservoir. The stirrer is rotated by a rotational drive mechanism installed on the reservoir. Molten solder is placed into the reservoir, high melting point metal particles are charged into the molten solder, stirring is performed with the stirrer to uniformly disperse the metal particles in the molten solder, and then the molten solder and dispersed metal particles are cast into a mold. Casting can be performed quickly after charging the metal particles into the molten solder, so the metal particles do not significantly melt into the molten solder.

7 Claims, 3 Drawing Sheets

POURING APPARATUS FOR MOLTEN METAL AND CASTING METHOD

TECHNICAL FIELD

This invention relates to an apparatus which can be used to pour molten metal into a casting mold and to a method of casting a solder product with dispersed metal particles.

BACKGROUND ART

Solder products for use in the manufacture of electrical and electronic equipment come in a wide variety of shapes of forms, such as ingots, rods, wires, pastes, and shaped forms such as pellets and washers. Most solder products consist entirely of a solder alloy which melts during a soldering process. However, when performing soldering using a solder product made solely of a solder alloy, it is sometimes difficult to maintain a desired spacing between two members to be soldered to each other.

For example, in die bonding, in which solder is sandwiched between a semiconductor element and a substrate and then the solder is heated to cause it to melt, the weight of the semiconductor element acting on the molten solder may cause a considerable amount of the molten solder to be squeezed out of the space between the semiconductor element and the substrate and reduce the size of the space. The reduction in the amount of solder remaining in the space between the two members results in a significant decrease in the bond formed by the solder.

To avoid this reduction in the spacing between members being soldered, solder products containing metal particles having a higher melting point than the solder (referred to below as metal particles) have been developed. When a solder product with dispersed metal particles is disposed between two members and heated, the solder melts but the metal particles remain substantially unmelted, so the metal particles can maintain a suitable spacing between the two members to hold a sufficient amount of molten solder to ensure a reliable joint between the members. Both solder pastes and solder pellets containing metal particles have been developed.

A solder paste with dispersed metal particles can be prepared simply by adding metal particles to a previously manufactured solder paste and stirring. The manufacture of solder pellets with dispersed metal particles is more complicated. First, metal particles are charged into a large melting pot containing molten solder, then the molten solder and the metal particles are stirred with a spatula to disperse the metal particles, and then the molten solder and dispersed metal particles are scooped from the melting pot with a ladle and cast into a mold for manufacturing a billet. The resulting billet is then extruded into the shape of a plate by an extruding apparatus, the plate is subjected to rolling, and then the rolled plate is punched with a press to form pellets of a desired shape.

DISCLOSURE OF THE INVENTION

A problem which occurs with conventional methods of manufacturing solder products, such as solder pellets, with dispersed metal particles is that a considerable amount of time may elapse between when the metal particles are charged into molten solder and when the molten solder and dispersed metal particles are cast into a mold. If a long time elapses, depending upon the composition of the solder, the metal particles may diffuse into the molten solder and significantly decrease in size or entirely disappear, no matter how high the melting point of the metal particles. Melting of metal particles into molten solder is not so much a problem with conventional Sn—Pb solders, which do not readily alloy with metal particles due to the high Pb content of the solders. It is a much more significant problem with lead-free solders, since such solders contain Sn as a primary component, and Sn readily alloys with the metals contained in metal particles. Therefore, when preparing a solder product with dispersed metal particles using a lead-free solder, it is difficult to ensure that the metal particles will have a desired diameter in the finished product.

The present inventors realized that if casting of molten solder with dispersed metal particles can be carried out soon after charging of the metal particles into the molten solder, the metal particles can be prevented from significantly melting into the molten solder, and a superior solder product with dispersed metal particles having a desired diameter can be obtained.

Accordingly, the present invention provides a molten metal pouring apparatus for use in casting of a product with dispersed metal particles. Additionally, it provides a method of casting a solder product with dispersed metal particles.

According to one form of the present invention, a molten metal pouring apparatus includes a reservoir capable of holding molten metal, a stirrer disposed within the reservoir, and a drive mechanism for rotating the stirrer drivingly connected to the stirrer.

According to another form of the present invention, a method of casting a solder product with dispersed metal particles comprises placing molten solder into a reservoir of a molten metal pouring apparatus, adding metal particles with a high melting point to the molten solder, stirring the molten solder to which the high melting point metal particles were added with a stirrer to uniformly disperse the high melting point metal particles in the molten solder, and casting the molten solder and dispersed metal particles into a mold.

With the present invention, even when preparing a solder product from a lead-free solder having Sn as a main component in which metal particles easily melt, metal particles can be dispersed in the solder without substantially decreasing in size. Therefore, pellets or other shaped members with dispersed metal particles manufactured from such a solder can have metal particles of a prescribed size uniformly dispersed therein. When such pellets are used for soldering, a prescribed gap can be maintained by the metal particles between portions being soldered, and a sufficient amount of solder can be maintained in the gap to obtain a strong soldered joint.

In a method according to the present invention, molten solder and metal particles can be directly cast from a reservoir in which stirring is performed into a mold, so casting into a mold can be performed soon after mixing the molten solder and the metal particles without the metal particles significantly melting into the molten solder.

BEST MODE FOR CARRYING OUT THE INVENTION

Figure 1:
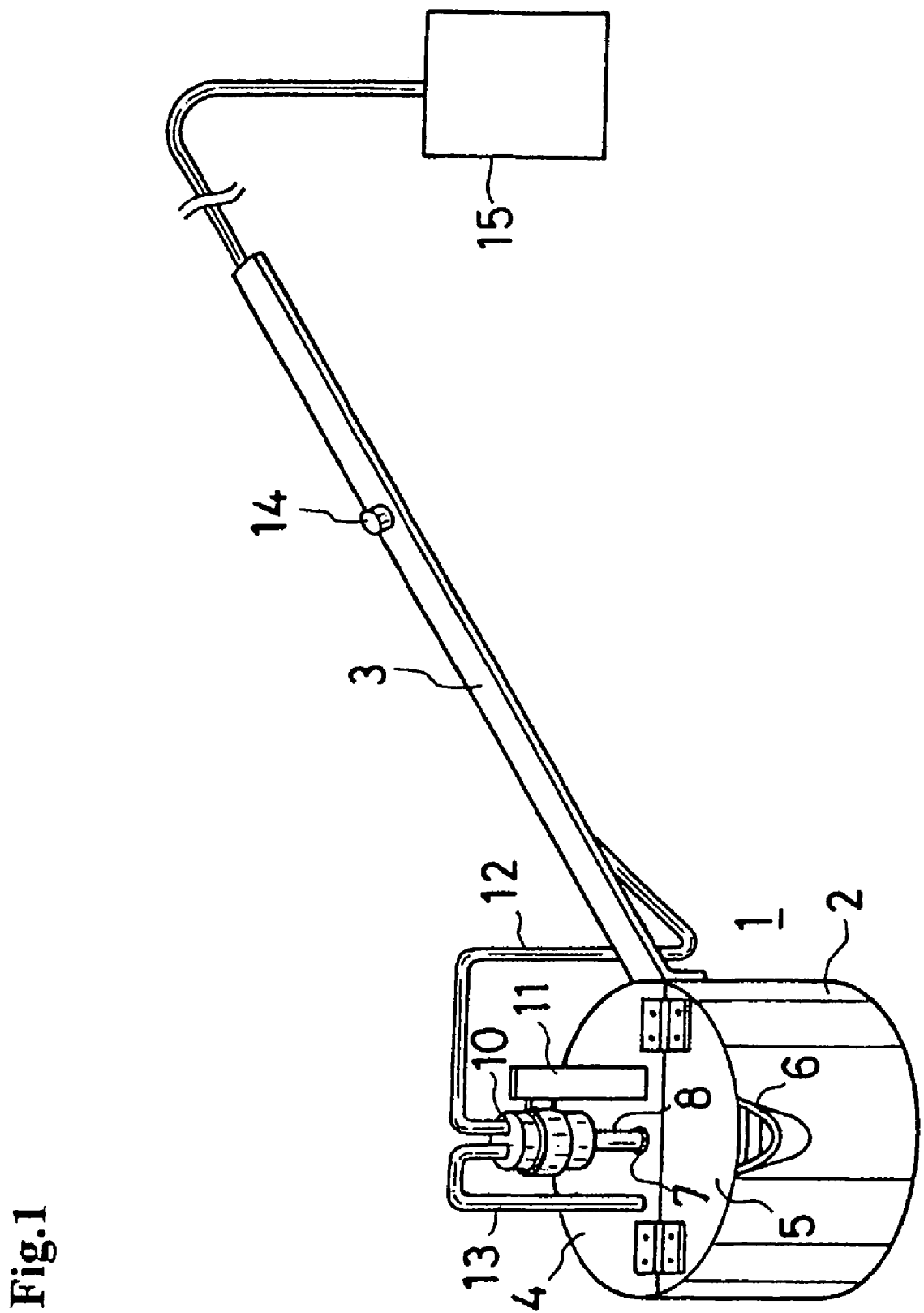
FIG. 1 is an axonometric view of an embodiment of a pouring apparatus according to the present invention.

A preferred embodiment of a molten metal pouring apparatus according to the present invention will be described while referring to the accompanying drawings. The embodiment of a molten metal pouring apparatus 1 shown in FIGS. 1 and 2 includes a reservoir 2 capable of holding molten solder without damage to the reservoir 2. The shape and size of the reservoir 2 are not restricted. The illustrated reservoir 2 comprises a cylindrical wall and flat top and bottom surfaces, and it has a size such that it can be easily lifted and manipulated by a human operator. The upper end of the reservoir 2 may be open to the atmosphere, but preferably the upper end is capable of being substantially isolated from the outside air to enable an inactive gas atmosphere to be maintained within the reservoir 2 during stirring as well as to prevent molten solder from being splattered to outside of the reservoir 2 during stirring or casting. In this embodiment, the upper end of the reservoir 2 is partially covered by a cover plate 4 secured to the upper end of the side wall of the reservoir 2, and an arc-shaped lid 5 is pivotably mounted on the cover plate 4 by hinges so that the portion of the upper end of the reservoir 2 not covered by the cover plate 4 can be selectively opened and closed by the lid 5. Together, the cover plate 4 and the lid 5 extend over the entire surface area of the upper end of the reservoir 2. The relative sizes of the cover plate 4 and the lid 5 are not restricted. In the illustrated embodiment, the cover plate 4 extends over approximately ⅔ of the area of the upper end of the reservoir 2. The area of the lid 5 is preferably large enough to permit molten solder and metal particles to be easily charged into the reservoir 2 when the lid 5 is open.

The reservoir 2 is preferably equipped with a discharge opening for molten solder so that molten solder can be directly poured from the reservoir 2 into a mold instead of having to be scooped from the reservoir 2 with a ladle, thereby enabling molten solder to be discharged from the reservoir 2 more rapidly. In this embodiment, a discharge opening is provided by a pouring spout 6 formed on the side wall of the reservoir 2 near its upper end.

The reservoir 2 is equipped with a stirring mechanism for stirring molten solder so as to uniformly disperse metal particles in the molten solder. In the present embodiment, the stirring mechanism comprises a stirrer in the form of a propeller 9 and a rotational drive mechanism 10 connected to the propeller by a drive shaft 8 extending through a hole 7 in the cover plate 4. The rotational drive mechanism 10 is not restricted to any particular type and can be selected from a variety of drive mechanisms, such as electric motors, hydraulic motors, and pneumatic motors. The rotational drive mechanism 10 is supported by a support bracket 11 which extends upwards from the cover plate 4 of the reservoir 2.

Figure 2:
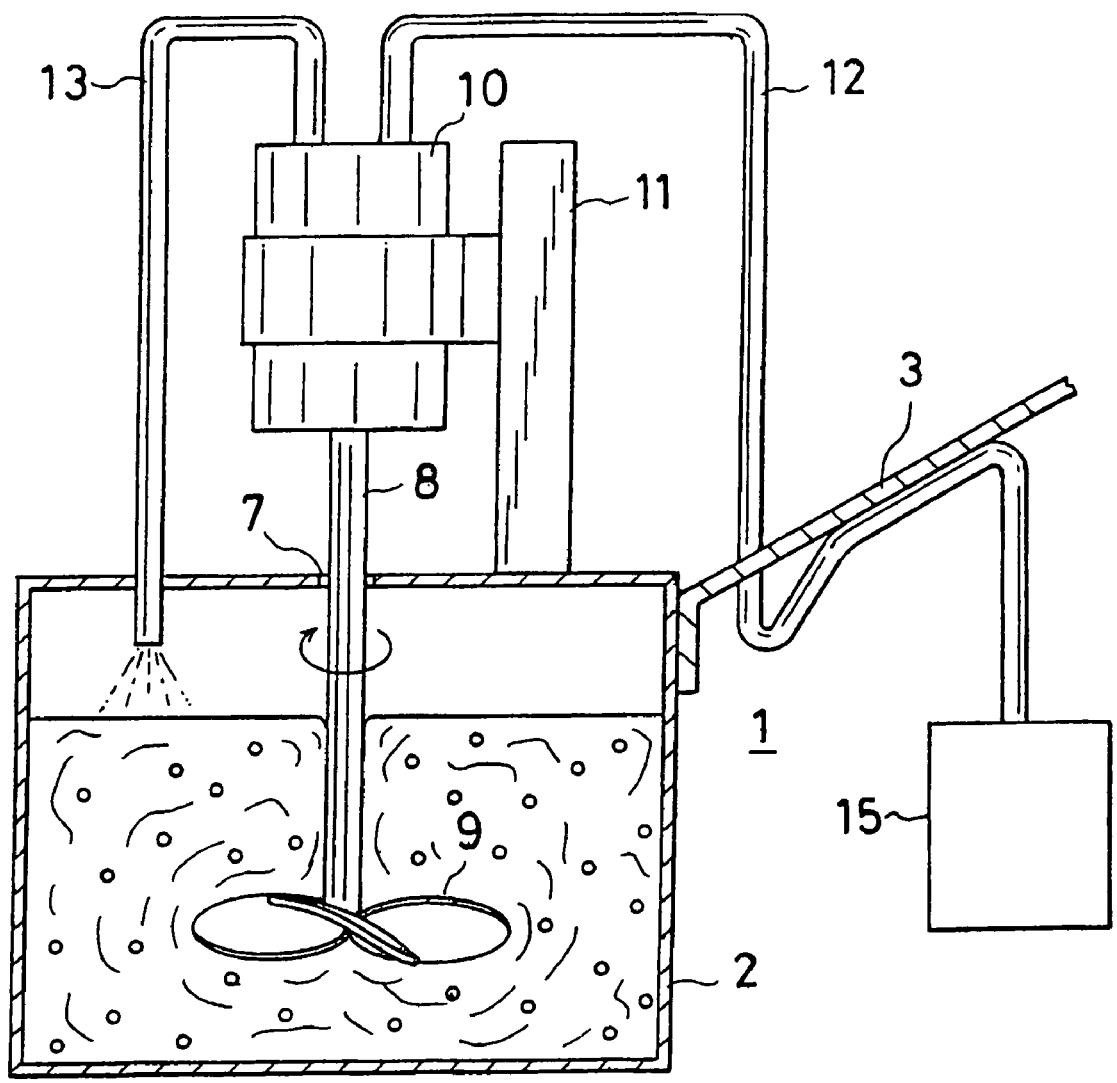
FIG. 2 is a vertical cross-sectional view of the embodiment of FIG. 1.

During stirring of molten solder in the reservoir 2 by the stirring mechanism, the molten solder is susceptible to oxidation, so in order to prevent oxidation, an inactive gas atmosphere is preferably formed in the upper portion of the reservoir 2 above the surface of the molten solder. The inactive gas may be nitrogen or any other inactive gas conventionally used to form a nonoxidizing atmosphere in soldering. In order to make efficient use of an inactive gas, in the present embodiment, the rotational drive mechanism 10 comprises an air motor which can be driven by the same inactive gas as is used to create an inactive gas atmosphere inside the reservoir 2. As shown in the drawings, an air inlet of the air motor is connected to a supply 15 of a pressurized inactive gas by a first gas supply line 12. The gas supply 15, which is schematically shown in FIG. 2, is not restricted to any particular structure, and may include any of a variety of equipment commonly used for supplying compressed gas, such as a compressed gas tank containing an inactive gas, a compressor, and a pressure regulator. A second gas supply line 13 has one end connected to an exhaust port of the air motor and another end communicating with the interior of the reservoir 2. A valve 14 may be installed along the first gas supply line 12. By opening and closing the valve 14, flow of inactive gas from inactive gas supply can be turned on and off to start and stop the operation of the air motor. After the compressed inactive gas drives the air motor, it is discharged into the upper portion of the interior of the reservoir 2 to form an inactive gas atmosphere.

The reservoir 2 may be equipped with structure enabling an operator to easily and safely transport and manipulate the reservoir 2 while remaining at a safe distance from molten solder. In the illustrated embodiment, the reservoir 2 is equipped with an elongated handle 3 which is secured to the upper portion of the side wall of the reservoir 2 and slopes upwards and away from the reservoir 2. The first gas supply line 12 extends along the bottom of the handle 3, and the valve 14 for the first gas supply line 12 is mounted on the handle 3 so as to be easily operated by an operator grasping the handle 3. The illustrated handle 3 is positioned with respect to the pouring spout 6 such that when an operator holds the lower portion of the handle 3 with his right hand and holds the upper portion of the handle 3 with his left hand, the pouring spout 6 faces in the same direction as the operator, thereby enabling molten solder to be easily poured into a mold from the pouring spout 6.

An example of a method of casting a solder product with dispersed metal particles using the embodiment of FIG. 1 will next be described while referring to FIGS. 3A-3D, which illustrate different steps in the method.

Figure 3A:
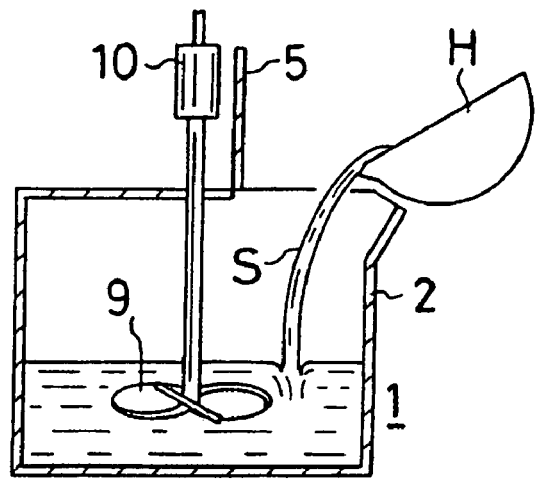
FIGS. 3A-3D are schematic cross-sectional views of the embodiment of FIG. 1 at different steps in a method of casting according to the present invention.

1. First, as shown in FIG. 3A, the lid 5 of the reservoir 2 of the molten metal pouring apparatus 1 is opened, and molten solder S which was previously melted in an unillustrated melting pot is poured into the reservoir 2 by a ladle H.

Figure 3B:
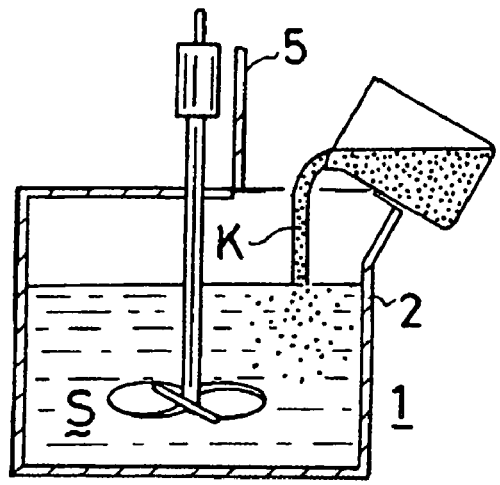

2. Next, as shown in FIG. 3B, metal particles K are charged into the molten solder S inside the reservoir 2.

Figure 3C:
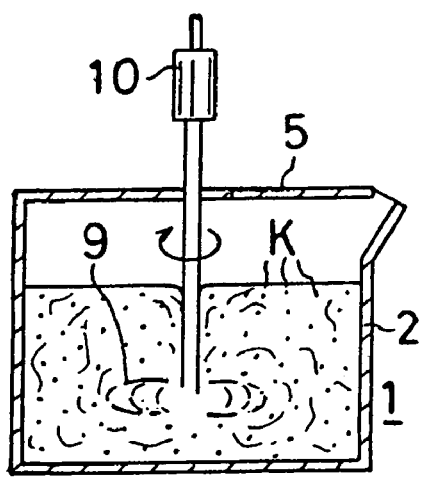

3. As shown in FIG. 3C, after the lid 5 of the reservoir 2 is closed, the valve 14 on gas supply line 12 is opened and inactive gas is supplied through gas supply line 12 to the air motor. The inactive gas drives the air motor and then is discharged from the air motor through gas supply line 13 into the upper portion of the reservoir 2 above the molten solder to form an inactive gas atmosphere. The stirrer comprising the propeller 9 is rotated by the air motor, and the metal particles K are uniformly dispersed in the molten solder S by stirring.

Figure 3D:
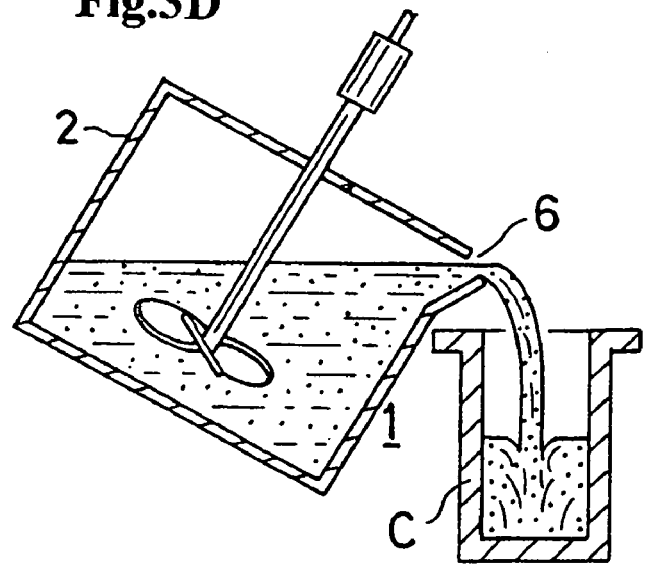

4. As shown in FIG. 3D, the pouring apparatus 1 is then moved by an operator holding the handle 3 to the vicinity of a mold C, and the reservoir 2 is tilted by the operator to pour the mixture of molten solder S and metal particles K into the mold C from the pouring spout 6.

If metal particles are simply charged into molten solder in the reservoir 2 in the second step, the metal particles may not be readily wet by the molten solder and may float on the surface of the molten solder instead of being uniformly dispersed, even when stirring is performed. If the metal particles are instead first mixed with a flux so as to coat the surface of the metal particles with the flux and then the mixture of metal particles and flux is charged into the molten solder, the metal particles can be readily wet by the molten solder and uniformly dispersed by stirring.

To illustrate the effects of the present invention, solder pellets containing dispersed metal particles were prepared from a Sn—Cu—Ni based lead-free solder and Ni particles with a diameter of 80 micrometers. The solder was melted in a melting pot and then poured into the reservoir 2 of a pouring apparatus in the manner shown in FIG. 3A. In order to enable the Ni particles to be wet by the molten solder, the particles were first mixed with a flux, and then the mixture of particles and flux was charged into the molten solder. The contents of the reservoir 2 were stirred with the stirrer and then cast into a cylindrical mold for a billet. The resulting billet was extruded to form an elongated plate, which was then rolled to a thickness of 0.1 mm with a rolling mill. The rolled plate was then punched to form pellets measuring 10×10 mm.

For comparison, pellets containing dispersed metal particles were prepared by a conventional manufacturing method. Namely, a Sn—Cu—Ni based lead-free solder was melted in a melting pot, and a mixture of Ni particles and flux was charged into the molten solder. The molten solder and the mixture were stirred with a metal spatula and then scooped out of the pot with a ladle and cast into a mold to form a billet. The resulting billet was extruded, rolled, and punched in the same manner as described above to form pellets measuring 10×10 mm.

Cross sections of the pellets prepared by the method of the present invention and by the conventional method were observed under a microscope. In the pellets prepared by the method according to the present invention, the Ni particles had a diameter of roughly 70-80 μm, indicating little melting of the Ni particles into the molten solder prior to casting. In contrast, in the pellets prepared by the conventional method, the Ni particles had a diameter of at most 40 micrometers, indicating that significant melting of the particles into the molten solder had taken place during the process of manufacturing the pellets.

INDUSTRIAL APPLICABILITY

A molten metal pouring apparatus according to the present invention is suitable for dispersing metal particles in molten solder, but it can also be used for melting or alloying of metals which readily oxidize in air.

The invention claimed is:

1. A hand-held molten metal pouring apparatus for use in hand casting of a molten metal mixture into a mold, the apparatus comprising a portable reservoir capable of holding a molten metal, the reservoir including a pouring spout formed on a side wall of the reservoir and a lid which can be selectively opened and closed to permit a molten metal and metal particles to be charged into the reservoir to form a molten metal mixture, an elongated handle extending transversely from the side wall of the reservoir in a location spaced from the pouring spout whereby a worker can pour the molten metal mixture from the reservoir into a mold through the pouring spout while grasping the handle, a stirrer disposed in the reservoir, and a rotational drive mechanism supported by the reservoir and drivingly connected to the stirrer.

2. A molten metal pouring apparatus as claimed in claim 1 wherein the rotational drive mechanism comprises an air motor having an exhaust port communication with the interior of the reservoir to supply gas which is exhausted from the air motor to the interior of the reservoir to form a gas atmosphere in an upper portion of the reservoir.

3. A molten metal pouring apparatus as claimed in claim 1 wherein the reservoir includes a cover plate secured to an upper end of the side wall of the reservoir adjoining the lid, and the drive mechanism has a drive shaft extending through an opening in the cover plate to the stirrer, the cover plate and the lid together defining an upper surface of the reservoir.

4. A molten metal pouring apparatus as claimed in claim 2 including a gas supply line extending along the handle to an air inlet of the air motor, and a valve disposed on the handle in a position in which it can be operated by a worker holding the handle and connected to the gas supply line leading to the air inlet to control flow of gas through the gas supply line to the air motor.

5. A method of casting a solder product with dispersed metal particles using the molten metal pouring apparatus of claim 1 comprising placing molten solder into the reservoir of the molten metal pouring apparatus, adding high melting point metal particles to the molten solder in the reservoir, stirring the molten solder and the metal particles to uniformly disperse the metal particles in the molten solder with the stirrer, and then casting the molten solder and metal particles directly from the reservoir into a mold through the pouring spout.

6. A method as claimed in claim 5 wherein the drive mechanism comprises an air motor, the method including supplying a gas to an inlet of the air motor, and supplying gas discharged from an exhaust port of the air motor to the interior of the reservoir.

7. A method as claimed in claim 6 including supplying inactive gas to the inlet bf the air motor, whereby the gas discharged from the exhaust port forms an inactive gas atmosphere within the reservoir above the molten solder.

* * * * *